(12) United States Patent
Nakai

(10) Patent No.: US 10,770,200 B2
(45) Date of Patent: Sep. 8, 2020

(54) SHIELDED CONDUCTIVE PATH

(71) Applicant: Sumitomo Wiring Systems, Ltd., Yokkaichi, Mie (JP)

(72) Inventor: Hirokazu Nakai, Mie (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 16/637,798

(22) PCT Filed: Jul. 18, 2018

(86) PCT No.: PCT/JP2018/026807
§ 371 (c)(1),
(2) Date: Feb. 10, 2020

(87) PCT Pub. No.: WO2019/031167
PCT Pub. Date: Feb. 14, 2019

(65) Prior Publication Data
US 2020/0258657 A1   Aug. 13, 2020

(30) Foreign Application Priority Data
Aug. 8, 2017 (JP) ................. 2017-153013

(51) Int. Cl.
*H01B 7/18* (2006.01)
*H01B 7/02* (2006.01)
(Continued)

(52) U.S. Cl.
CPC .......... *H01B 7/18* (2013.01); *B60R 16/0215* (2013.01); *H01B 7/0045* (2013.01); *H01B 7/02* (2013.01)

(58) Field of Classification Search
CPC .......... H01B 7/18; H01B 7/0045; H01B 7/02; B60R 16/0215
(Continued)

(56) References Cited

U.S. PATENT DOCUMENTS

| 1,853,677 | A | * | 4/1932 | Fischer | ................. | H01B 11/12 174/32 |
| 2008/0173465 | A1 | * | 7/2008 | Nair | ..................... | H01B 7/0876 174/117 FF |

(Continued)

FOREIGN PATENT DOCUMENTS

| JP | 2006-311699 | 11/2006 |
| JP | 2014-123478 | 7/2014 |

(Continued)

OTHER PUBLICATIONS

International Search Report dated Sep. 18, 2018.

*Primary Examiner* — Timothy J Thompson
*Assistant Examiner* — Michael F McAllister
(74) *Attorney, Agent, or Firm* — Gerald E. Hespos; Michael J. Porco; Matthew T. Hespos

(57) ABSTRACT

It is aimed to realize a height reduction of a shielded conductive path and improve a heat dissipating function. In a shielded conductive path (W) in which a plurality of conductive members (1) each including a conductor portion (2), an insulating portion (3) and a shield portion (4) disposed from a central part toward an outer peripheral side are arranged in parallel, at least one of the conductor portion (2), the insulating portion (3) and the shield portion (4) is formed by a shape retaining member capable of retaining each conductive member (1) in a set shape.

3 Claims, 4 Drawing Sheets

(51) Int. Cl.
*H01B 7/00* (2006.01)
*B60R 16/02* (2006.01)

(58) Field of Classification Search
USPC .................................................. 174/102 R
See application file for complete search history.

(56) References Cited

U.S. PATENT DOCUMENTS

2012/0043107 A1* 2/2012 Nair .................... H01B 7/0876
174/103
2014/0374135 A1 12/2014 Nagahashi
2016/0189828 A1* 6/2016 Oga ....................... H01B 7/282
174/72 A
2017/0144615 A1 5/2017 Kuroishi et al.

FOREIGN PATENT DOCUMENTS

| | | |
|---|---|---|
| JP | 2015-088251 | 5/2015 |
| JP | 2016-136460 | 7/2016 |
| JP | 2017-099155 | 6/2017 |
| WO | 2013/137230 | 9/2013 |

* cited by examiner

SHIELDED CONDUCTIVE PATH

BACKGROUND

Field of the Invention

The invention relates to a shielded conductive path.

Related Art

Japanese Unexamined Patent Publication No. 2006-311699 below discloses a structure for connecting a battery and an inverter by a high-voltage wiring harness in an electric or hybrid vehicle.

An intermediate part of the wiring harness is accommodated in a shield pipe made of metal. The shield pipe is disposed below a floor of the vehicle and is bent with respect to a height direction and a vehicle width direction. Both end parts of the wiring harness are drawn out from both ends of the shield pipe and are connected respectively to connectors. Parts of the wiring harness drawn out from the shield pipe are inserted respectively into flexible shield members (braided wires). One end of the braided wire is connected to the corresponding end of the shield pipe and the other end is connected to the connector side.

The wiring harness is composed of two or more wires. These wires have been accommodated collectively in the shield pipe and are arranged laterally side by side in the vehicle width direction in many cases. As just described, the wires are accommodated collectively, and relatively large spaces conventionally have been formed in the height direction between the wires in the shield pipe. Thus, there has been a problem of being bulky in the height direction in the conventional case.

Further, the formation of large spaces in the shield pipe means a small contact area between the wires and the shield pipe. Thus, even if heat is generated in the wires by energization, heat tends to accumulate in the shield pipe and there has been room for improvement in terms of heat dissipation.

The invention was completed on the basis of the above situation and aims to provide a shielded conductive path capable of realizing a height reduction and improving heat dissipation.

SUMMARY

The invention is directed to a shielded conductive path in which conductive members are arranged in parallel. Each conductive member includes a conductor, an insulating portion and a shield disposed from a central part toward an outer peripheral side. At least one of the conductor, the insulating portion and the shield is formed by a shape retaining member capable of retaining each conductive member in a set shape.

According to the present invention, the conductive members are not collectively accommodated by a shield as before, but each conductive member is accommodated individually by the shield. Thus, a large space is not formed inside the shield. Further, since a contact area of the conductor and the shield is ensured, the shielded conductive path can realize both a height reduction and an improvement in heat dissipation.

The shielded conductive path may be such that the conductor is formed by a pipe made of conductive metal and doubles as the shape retaining member. According to this configuration, a shape retaining function of the conductive member can be exhibited by the conductor portion.

The conductor may be squeezed in a height direction. According to this configuration, each conductive member can be reduced in height.

The insulating portion may be formed by a resin pipe for accommodating the conductor portion and may double as the shape retaining member. According to this configuration, the shape retaining function of the conductive member can be exhibited by the insulating portion.

The shield may be formed by a pipe made of conductive metal and may double as the shape retaining member. According to this configuration, the shape retaining function of the conductive member can be exhibited by the shield portion.

DETAILED DESCRIPTION

Next, first to third specific embodiments of a shielded conductive path of the invention are described with reference to the drawings.

First Embodiment

A first embodiment of the invention is described with reference to FIGS. 1 to 3.

Figure 1:
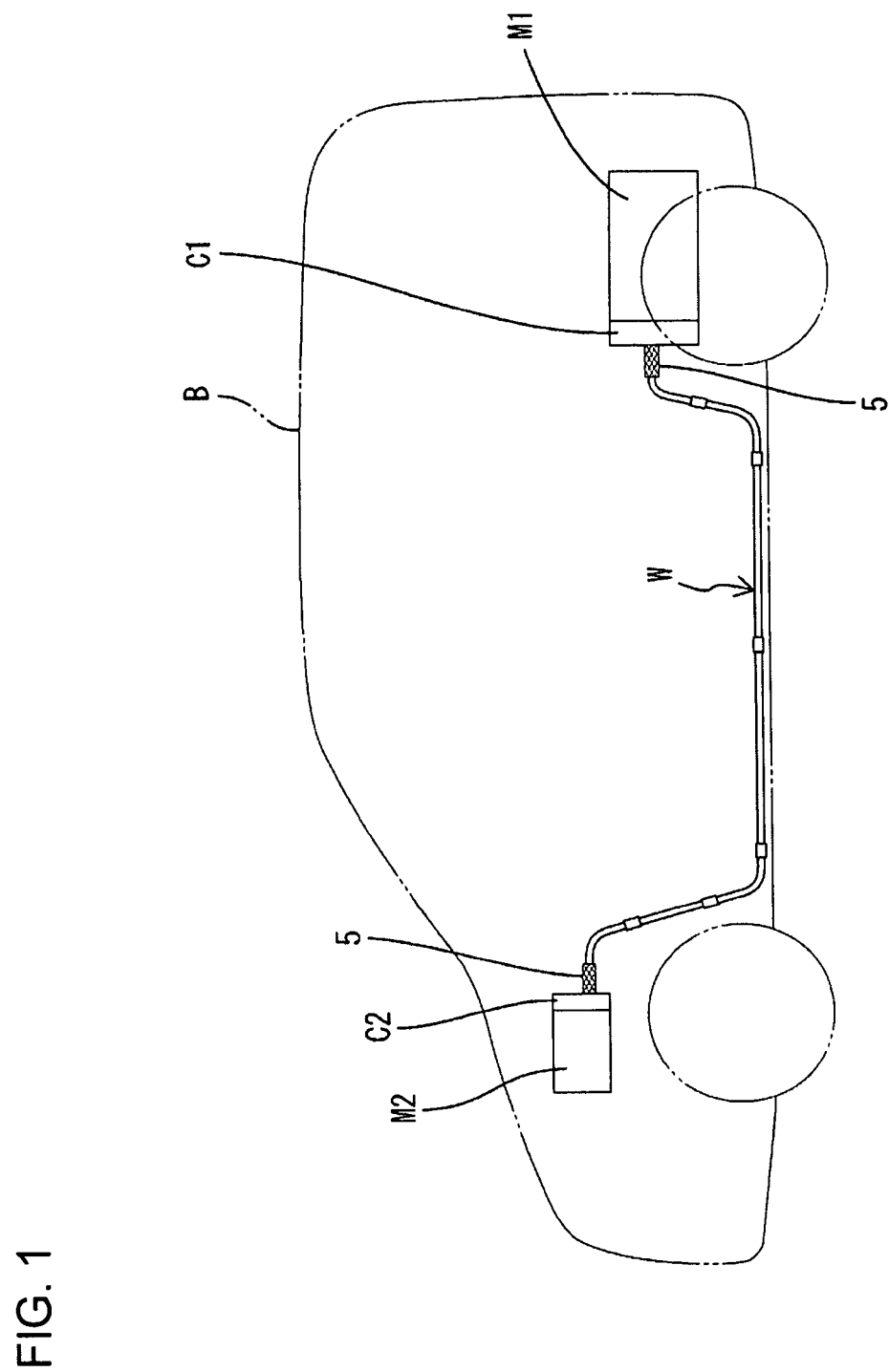
FIG. 1 is a schematic diagram showing a routed state of a shielded conductive path in a vehicle.

A shielded conductive path W in the first embodiment is routed below and along a floor of a vehicle B to connect, for example, a device M1 such as a high-voltage battery provided in a rear part of the vehicle B and a device M2 such as an inverter or fuse box provided in a front part of the vehicle B via connectors C1, C2 in the vehicle B such as a hybrid vehicle as shown in FIG. 1.

Figure 2:
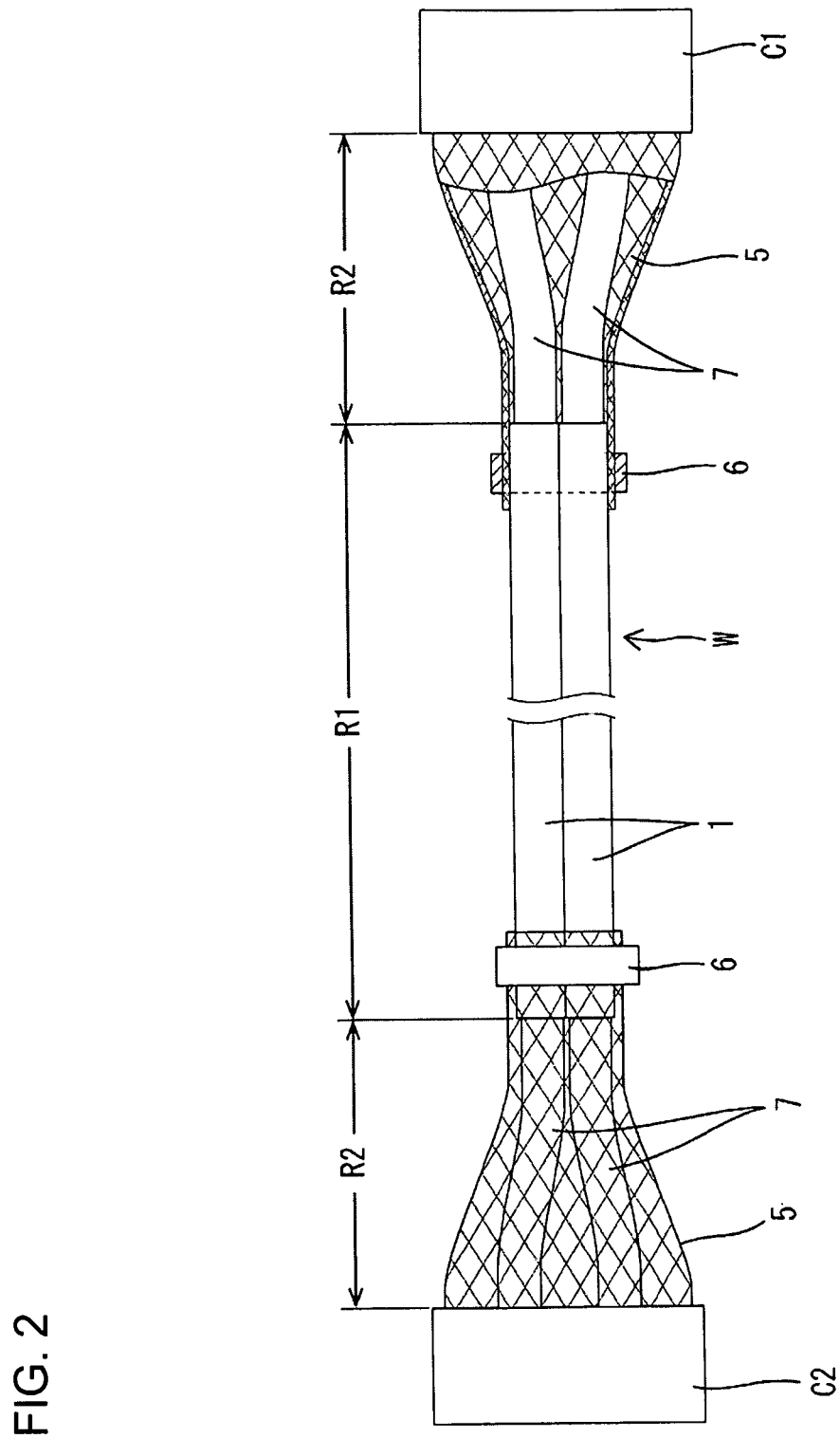
FIG. 2 is a plan view showing the configuration of the entire shielded conductive path.

As shown in FIG. 2, an intermediate part of the shielded conductive path W in the first embodiment in a front-rear direction of the vehicle B constitutes a rigid region R1 and both end parts thereof respectively constitute flexible regions R2. The rigid region R1 includes two conductive members 1 both having a shape retaining function. The conductive members are routed below the floor of the vehicle B in a state arranged in parallel in a vehicle width direction and are held in contact with each other (see 2 in FIG. 3). An intermediate part of the conductive member 1 is routed while being bent into a predetermined shape in the vehicle width direction and a height direction. Note that a process of bending the conductive member 1 is performed after the conductive member 1 is assembled by way of a process of inserting a conductor portion 2 and the like.

Figure 3:
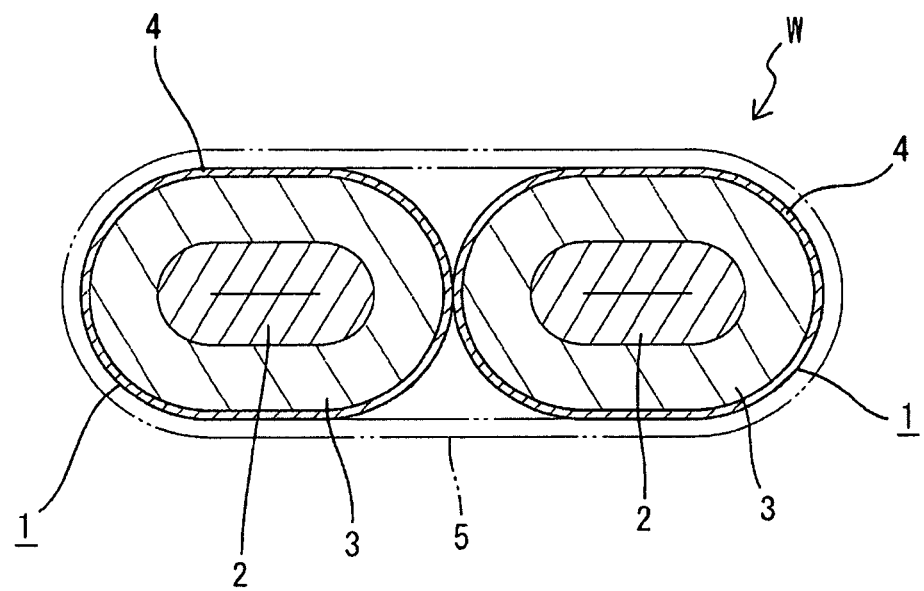
FIG. 3 is a section of a shielded conductive path according to a first embodiment.

As shown in FIG. 3, the conductive members 1 of the first embodiment are such that conductors 2 individually are surrounded and electromagnetically shielded by shields 4 via insulating portions 3.

Each conductor 2 in the first embodiment is constituted by a single-core wire. Specifically, the conductor 2 in this embodiment is formed of a conductive elongated metal pipe made of copper, copper alloy, aluminum or aluminum alloy. This conductor 2 mainly functions as a shape retaining member. The tubular insulating portion 3 (insulating resin layer) is laminated concentrically on the entire outer peripheral surface of the conductor 2. The conductor 2 is squeezed in a vehicle height direction together with the insulating portion 3 to have a flat elliptical shape extending in the vehicle width direction over the entire length. In this way, a height of the conductive member 1 is reduced in the vehicle height direction.

Further, the outer peripheral surfaces of the insulating portions 3 in the both conductive members 1 are surrounded over the entire areas by the shields 4. Specifically, the shield 4 is formed by spirally winding a ribbon-like member made of a conductive metal foil without any gap and adhering the ribbon-like member to the outer peripheral surface of the insulating portion 3. A process of winding the shield portion 4 may be performed after the above process of bending the conductor 2 and the insulating portion 3. Note that a coating film of a predetermined color (e.g. orange color) may be applied to the entire surface of the shield 4 to call for attention for a high-voltage current and protect against a collision after the above process of winding the ribbon-like member.

In this way, the both conductive members 1 in the first embodiment are individually surrounded by the shields 4 unlike before.

Next, the flexible regions R2 are described. The flexible regions R2 are required to be routed flexibly since these are routed in relatively narrow spaces in an engine compartment or a vehicle interior. Thus, in this embodiment, the flexible regions R2 employ a configuration in which two flexible stranded wires 7 collectively are surrounded by a braided wire 5. Insulation coatings are stripped on ends of both stranded wires 7 to expose cores (not shown). On the other hand, both end parts of the conductors 2 project in a front-rear direction from both ends of the insulating portions 3 and the shields 4 on both end parts of the rigid region R1 in a vehicle length direction. The exposed cores of the stranded wires 7 are connected to the upper or lower squeezed surfaces of the corresponding conductors 2 by welding or the like on the projecting end parts of the conductors 2. Unillustrated terminal fittings are connected to the other ends of the stranded wires 7 and are accommodated in the connectors C1, C2.

The braided wire 5 is configured by braiding a multitude of conductive thin metal wires into a tubular shape and has good flexibility. The conductive members 1 are fit collectively into an end part of the braided wire 5 on the side of the rigid region R1, this end part of the braided wire 5 is fastened and fixed by a fastening member 6 to be electrically connected to the shields 4. The other end part of the braided wire 5 is connected electrically to a shield member (not shown) made of conductive metal and mounted in the corresponding connector C1, C2.

Next, functions and effects of the first embodiment configured as described above are described. The shielded conductive path W in the first embodiment employs a method for individually surrounding each conductive member 1 by the shield instead of a conventional method for collectively surrounding two conductive members by a shield. Specifically, if conductive members arranged in parallel in the vehicle width direction are collectively surrounded by a shield having a circular cross-section, empty spaces have to be formed above and below the conductive members in the shield. Conventionally, this has been a factor hindering a height reduction of the shielded conductive path. However, with the method for individually surrounding the respective conductors 2 and insulating portions 3 by the shields 4 as in the first embodiment, the shields 4 can surround the conductors 2 and the insulating portions 3 while being substantially held in close contact. Thus, useless empty spaces are not formed on upper and lower sides in the shields 4 unlike before, and a height reduction of the shielded conductive path W can be achieved.

The conductors 2 are formed by squeezing the metal pipes from the vehicle height direction in the first embodiment. This has an effect of further reducing the height.

Further, the conductive members 1 generate heat by energization. In the conventional case, heat may be accumulated in the upper and lower spaces in the shield and reduce electrical characteristics in the conductor portions. However, in the first embodiment, almost no space is present in the shield 4, i.e. an insulation layer is not formed. Since the shield 4 surrounds the insulating portion 3 while being held in close contact with the insulating portion 3 in this way, heat generated in the conductor 2 can smoothly escape to outside by a heat dissipation path formed by the conductor 2, the insulating portion 3 and the shield 4. This is effective in maintaining electrical characteristics in the conductor portion 2.

Further, the conductor portion 2 is constituted by a single core obtained by processing the metal pipe in the first embodiment. Thus, the conductor 2 can mainly function as the shape retaining member for retaining a predetermined bent shape. Therefore, it is not necessary to add a special member for shape retention, which contributes to a reduction in the number of components and a simplified configuration.

Second Embodiment

Figure 4:
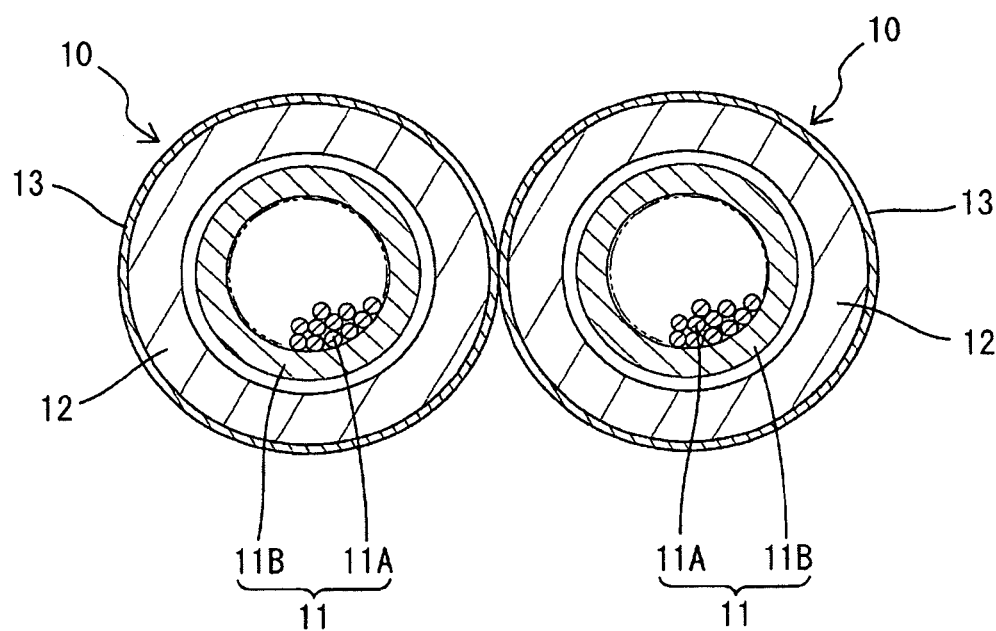
FIG. 4 is a section of a shielded conductive path according to a second embodiment.

FIG. 4 shows conductive members 10 according to a second embodiment of the invention. A conductor 11 in the second embodiment is constituted by a stranded wire. The conductor 11 is composed of a core 11A formed by spirally stranding a multitude of thin wires and an insulation coating 11B surrounding an outer peripheral side of the core 11A. The conductor 11 itself is flexible and in a so-called unstiffened state.

An insulating portion 12 is constituted by a pipe material made of synthetic resin and has a circular cross-section. In the second embodiment, this insulating portion 12 functions as the shape retaining member of the invention. The conductor 11 is inserted loosely through one end part of the insulating portion 12 and substantially concentrically surrounded with a tiny clearance defined between the outer periphery of the conductor 11 and the insulating portion 12.

The insulating portion 12 is formed by way of a bending process to have a predetermined bent shape after the conductor portion 11 is inserted therein. The insulating portion 12 may be bent in consideration of a return after the bending process in advance. Further, it is also considered that the insulating portion 12 has a multi-layer structure including a metal layer besides having a single layer structure made of a synthetic resin material as in the second embodiment and enhances a shape retaining function in cooperation with this metal layer part.

Note that both end parts of the conductor 11 project both forwardly and rearwardly of a vehicle from the insulating portion 12 and a shield 13 to be described next and are connected to wires in flexible regions R2.

The shield 13 is formed by a conductive metal layer laminated over the entire outer peripheral surface of the insulating portion 12. Thus, the shield 13 accommodates the conductor 12 while substantially concentrically surrounding the conductor portion 12 over the entire circumference. Both shields 13 in a rigid region R1 may be connected collectively to braided wires 5 in the flexible regions R2, but may be extended integrally from the rigid region R1 to the flexible regions R2 and both connected to shield members (not shown) of connectors C1, C2.

Also in the shielded conductive path W of the second embodiment configured as described above, the shield 13 individually surrounds the conductor portion 11 and the insulating portion 12 and no space is formed between the shield 13 and these conductor portion 11 and insulating portion 12 in a height direction. This is effective in realizing a height reduction and enhancing a heat dissipating function.

Further, the shape retaining function is performed by the insulating portion 12 inside the shield 13. Thus, the insulating portion 12 and the conductor portion 11 can be protected by the shield 13, which is a metal member. Further, by providing the shield 13, the springback of the insulating portion 12 during the bending process is mitigated, and the shape retaining function of the insulating portion 12 can be enhanced.

Third Embodiment

Figure 5:
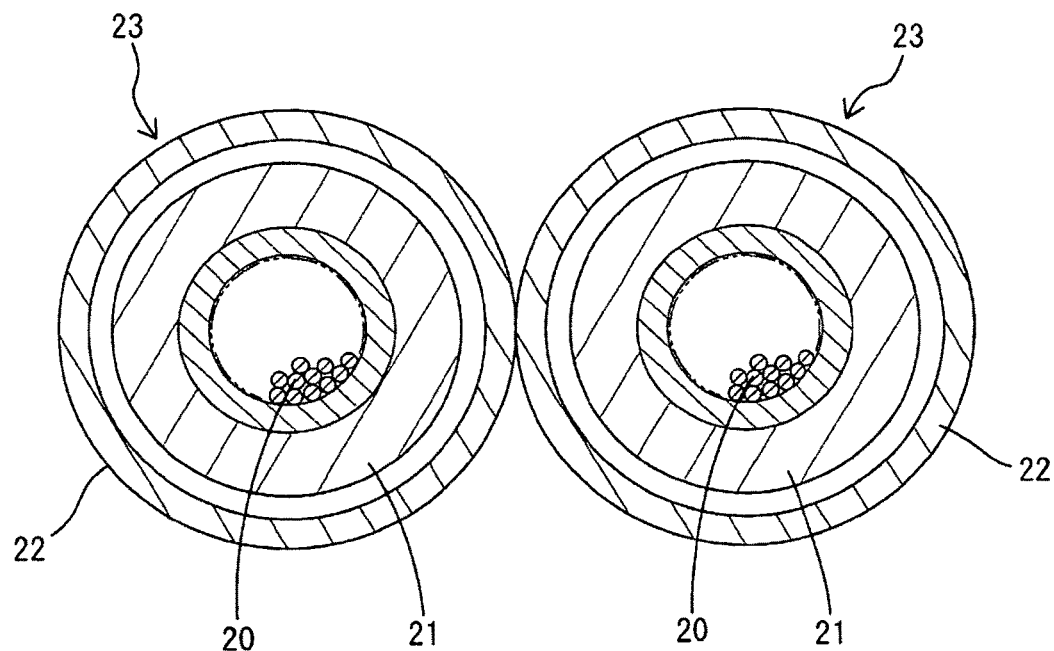
FIG. 5 is a section of a shielded conductive path according to a third embodiment.

FIG. 5 shows a third embodiment of the invention. A conductor portion 20 in the third embodiment also is constituted by a stranded wire as in the second embodiment. An insulating portion 21 of the third embodiment is constituted by an insulation coating of the stranded wire.

A shield 22 is formed by a conductive metal pipe. In the third embodiment, this shield 22 functions as the shape retaining member of the invention. The conductor 20 and the insulating portion 21 are inserted loosely through one end part of the shield 22. Thus, the conductors 20 and the insulating portions 21 in respective conductive member 23 are surrounded individually by the shields 22. A suitable clearance necessary for an inserting operation into the shield 22 is defined between the shield 22 and the insulating portion 21, but this clearance is tiny as compared to conventionally formed clearances.

Note that the shield 22 is bent into a predetermined shape by way of a bending process after the conductor 20 and the insulating portion 21 are inserted.

Both end parts of the conductor 20 project in a front-rear direction from the shield 22 and are connected to wires in flexible regions R2 with the insulation coating stripped. The shields 22 in a rigid region R1 and braided wires 5 in the flexible regions R2 are connected in the same manner as in the first embodiment by fastening members 6.

Also in a shielded conductive path W of the third embodiment configured as described above, the shield 22 individually surrounds the conductor 20 and the insulating portion 21 and no useless space is formed between these parts in a height direction. This is effective in realizing a height reduction and enhancing a heat dissipating function.

Further, there is a concern for the springback in the bending process in the second embodiment since the shape retaining function is performed by the insulating portion 21. However, since there is no such concern in the third embodiment, there is an advantage of easy shape retention. Furthermore, since the shield 22 is formed to have a predetermined thickness for shape retention, a function of protecting the conductor 20 and the like is also high.

Other Embodiments

The invention is not limited to the above described and illustrated embodiments. For example, the following embodiments also are included in the scope of the invention.

Although the conductor 2 is formed by the pipe material made of metal in the first embodiment, an elongated flat plate may be used instead of the pipe material or a bar material having a circular cross-section may be squeezed in the height direction.

Although the method for manufacturing the shield 4 by spirally winding and adhering the ribbon-like material in the above first embodiment, a method for laminating a metal foil on the entire outer peripheral surface of the insulating portion 3 and laminating a protection layer made of a resin material on the outer peripheral surface of the metal foil to surround the metal foil may be employed instead of this.

Although the shielded conductive path W is constituted by two conductive members in any of the embodiments, the number of the conductive members does not matter as long as two or more conductive members are used.

LIST OF REFERENCE SIGNS 1, 10, 23 . . . conductive member
2, 11, 20 . . . conductor portion
3, 12, 21 . . . insulating portion
4, 13, 22 . . . shield portion
W . . . shielded conductive path

The invention claimed is:

1. A shielded conductive path in which a plurality of conductive members each including a conductor, an insulating portion and a shield disposed from a central part toward an outer peripheral side are arranged in parallel in a width direction, wherein:
   at least one of the conductor, the insulating portion and the shield is formed by a shape retaining member capable of retaining each conductive member in a set shape,
   the conductor is formed by a pipe made of conductive metal and comprises the shape retaining member, and
   a plurality of the conductor constituting the plurality of conductive members arranged in parallel in the width direction are squeezed in a height direction into a flat shape extending in the width direction.

2. The shielded conductive path of claim 1, wherein the insulating portion is formed by a resin pipe for accommodating the conductor and comprises the shape retaining member.

3. The shielded conductive path of claim 1, wherein the shield is formed by a pipe made of conductive metal and comprises the shape retaining member.

* * * * *